United States Patent
Stamper et al.

(10) Patent No.: US 9,761,526 B2
(45) Date of Patent: Sep. 12, 2017

(54) INTERCONNECT STRUCTURE HAVING TUNGSTEN CONTACT COPPER WIRING

(71) Applicant: GLOBALFOUNDRIES INC., Grand Cayman (KY)

(72) Inventors: Anthony K. Stamper, Burlington, VT (US); Baozhen Li, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/014,759

(22) Filed: Feb. 3, 2016

(65) Prior Publication Data

US 2017/0221831 A1    Aug. 3, 2017

(51) Int. Cl.
*H01L 21/44* (2006.01)
*H01L 21/768* (2006.01)
(Continued)

(52) U.S. Cl.
CPC .. *H01L 23/53238* (2013.01); *H01L 21/76805* (2013.01); *H01L 21/76843* (2013.01);
(Continued)

(58) Field of Classification Search
CPC ........... H01L 23/53238; H01L 23/5226; H01L 23/528; H01L 23/53257; H01L 21/76805; H01L 21/76843; H01L 21/76883
USPC ................ 257/751, 758, 761, 774, E21.476, 257/E21.584, E23.161; 438/687, 653, 438/643, 627
See application file for complete search history.

(56) References Cited

U.S. PATENT DOCUMENTS 6,309,964 B1    10/2001    Tsai et al.
6,992,344 B2    1/2006    Coolbaugh et al.
(Continued)

FOREIGN PATENT DOCUMENTS

CN    102437096 A    5/2012

OTHER PUBLICATIONS

Anonymous, "Method for integrating transistors with a first-layer Cu interconnect," An IP.com Prior Art Database Technical Disclosure, Dec. 10, 2003.
(Continued)

*Primary Examiner* — Dao H Nguyen
(74) *Attorney, Agent, or Firm* — David Cain; Hoffman Warnick LLC

(57) ABSTRACT

Aspects of the present disclosure include interconnect structures for an integrated circuit (IC) structure and methods of making the same. The interconnect structures include one or more electronic devices formed on a substrate. A first interlevel dielectric (ILD) layer is over the one or more electronic devices. The interconnect structure includes a first trench in the first ILD layer. A tungsten contact fills the first trench and is in electrical contact with the one or more electronic devices. A second ILD layer is over the first ILD layer. The interconnect structure includes a second trench in the second ILD layer. Diffusion barrier liners bound all sides of the second trench except at a surface of the tungsten contact. The interconnect structure includes a copper wire filling the second trench, the copper wire in direct contact with the tungsten contact and with the diffusion barrier liners.

6 Claims, 9 Drawing Sheets

(51) Int. Cl.
*H01L 23/522* (2006.01)
*H01L 23/532* (2006.01)
*H01L 23/528* (2006.01)

(52) U.S. Cl.
CPC ...... *H01L 21/76883* (2013.01); *H01L 23/528* (2013.01); *H01L 23/5226* (2013.01); *H01L 23/53257* (2013.01)

(56) References Cited

U.S. PATENT DOCUMENTS

| | | | |
|---|---|---|---|
| 7,230,336 B2 | 6/2007 | Adams et al. | |
| 8,692,288 B2 | 4/2014 | Dunn et al. | |
| 2002/0121699 A1 | 9/2002 | Cheng et al. | |
| 2002/0142582 A1 | 10/2002 | Kim | |
| 2009/0096103 A1* | 4/2009 | Park | H01L 21/76831 257/751 |
| 2009/0176369 A1* | 7/2009 | Nickel | H01L 21/76834 438/687 |
| 2015/0249038 A1* | 9/2015 | Xu | H01L 23/53223 257/751 |
| 2015/0303100 A1* | 10/2015 | Liu | H01L 23/5226 257/751 |
| 2016/0276297 A1* | 9/2016 | Wu | H01L 29/66477 |

OTHER PUBLICATIONS

IBM, "Methods to electrochemically fill contact vias with alternative materials to replace CVD tungsten for lower contact resistance," An IP.com Prior Art Database Technical Disclosure. Mar. 26, 2008.

Ishigami et al., "High Reliability Cu Interconnection Utilizing a Low Contamination CoWP Capping Layer," Interconnect Technology Conference, 2004. Proceedings of the IEEE 2004 International. pp. 75-77 (2004).

Saito et al., "A Novel Copper Interconnection Technology Using Self Aligned Metal Capping Method," Interconnect Technology Conference, 2001. Proceedings of the IEEE 2001 International. pp. 15-17 (2001).

* cited by examiner

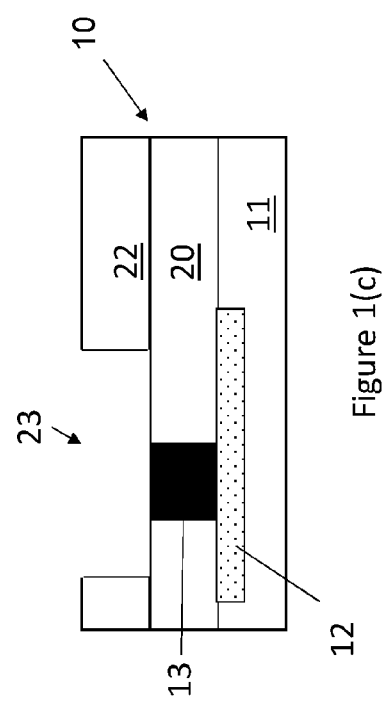

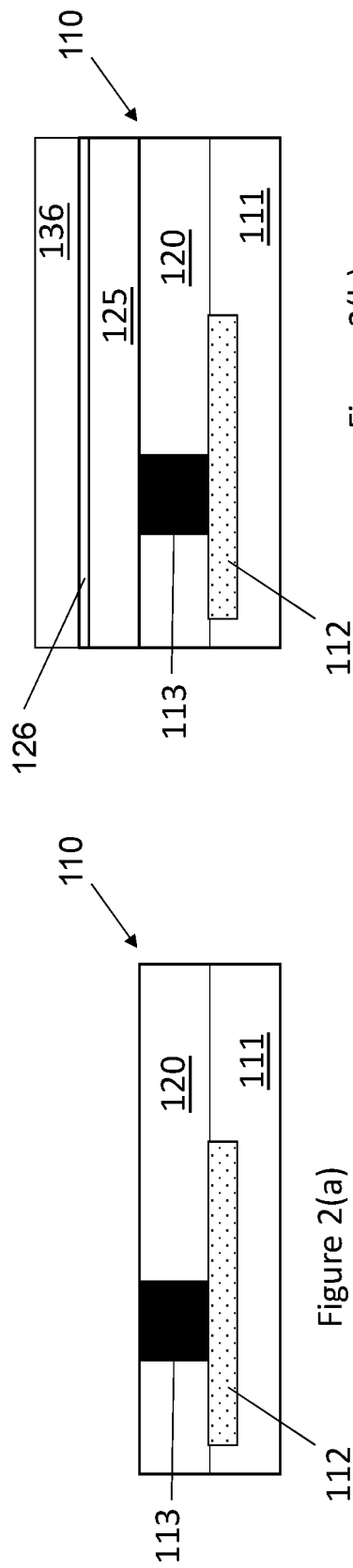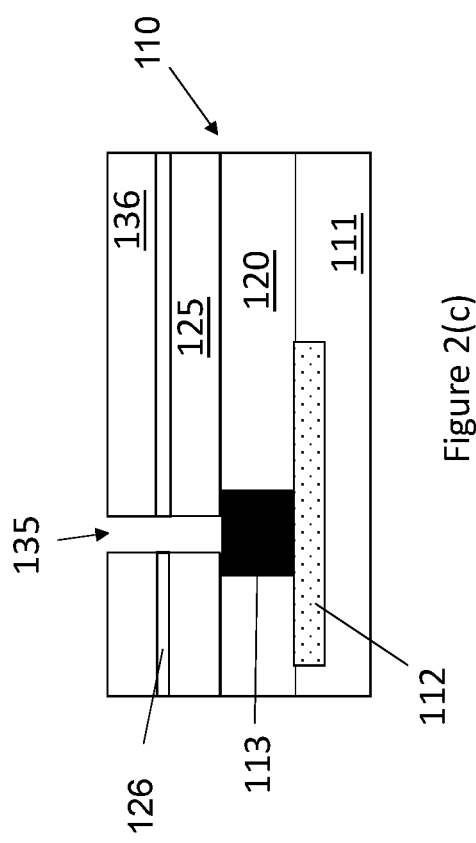

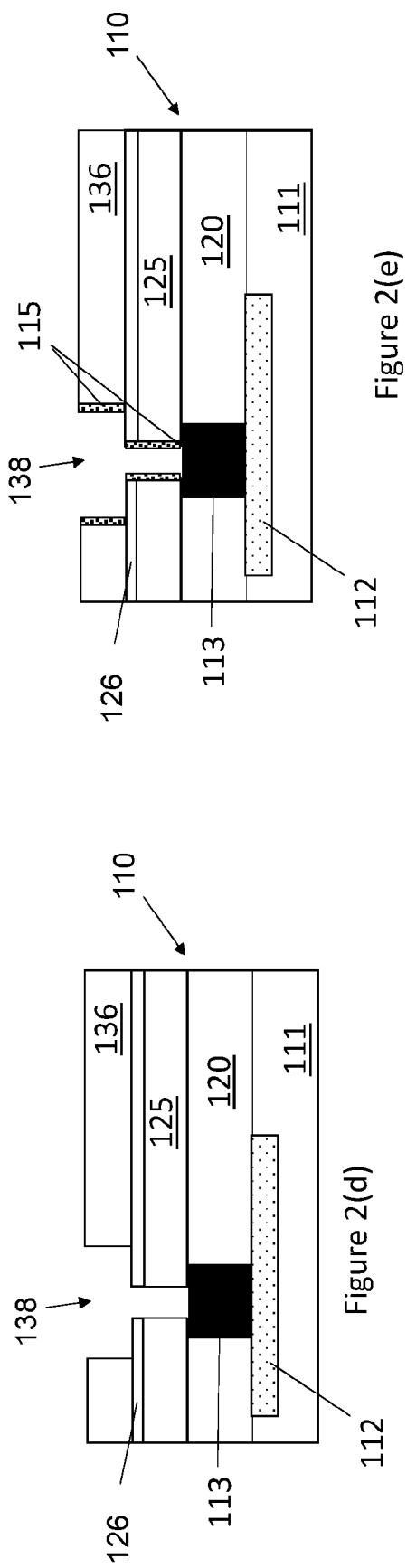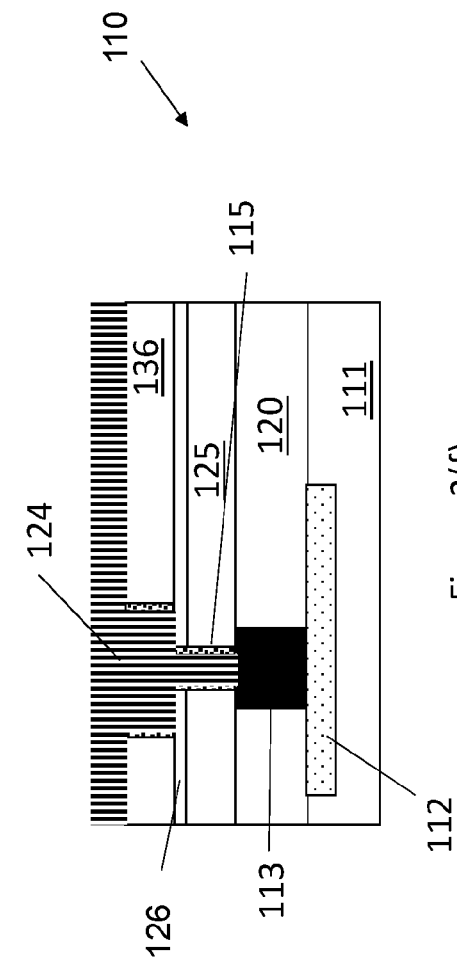

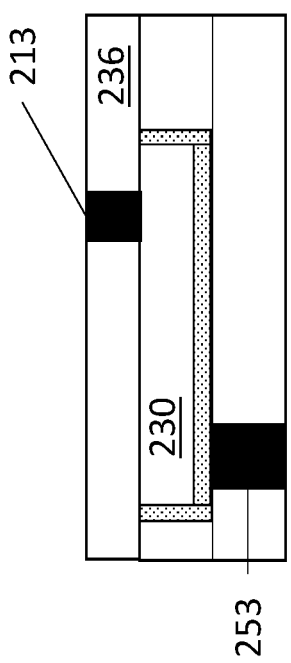

INTERCONNECT STRUCTURE HAVING TUNGSTEN CONTACT COPPER WIRING

FIELD OF THE INVENTION

The subject matter disclosed herein relates to integrated circuit (IC) structures including an interconnect structure for connecting one or more electronic devices with a tungsten plug and a copper wire. More specifically, aspects of the disclosure relate to interconnect structures IC structures and a method of manufacturing interconnect structures.

BACKGROUND

Each integrated circuit (IC) can be made up of billions of interconnected devices, such as transistors, resistors, capacitors, and diodes, located on one or more layers of an IC. These interconnected devices are often electrically connected with interconnect structures that include copper wires and tungsten contacts. Copper wires require a diffusion barrier liner to prevent migration of copper atoms into adjacent layers such as dielectrics, semiconductors or conductors. Greater scaling and sophistication of the ICs requires smaller wires. As the copper wire widths have become smaller, the impact of resistance by the liner has becomes greater.

BRIEF SUMMARY

A first embodiment of the present disclosure provides an interconnect structure for one or more electronic devices formed on a substrate, the interconnect structure including a first interlevel dielectric (ILD) layer is over the one or more electronic devices. The interconnect structure includes a first trench in the first ILD layer. A tungsten plug fills the first trench and is in electrical contact with the one or more electronic devices. A second ILD layer is over the first ILD layer. The interconnect structure includes a second trench in the second ILD layer. Diffusion barrier liners bound all sides of the second trench except at a surface of the tungsten plug. The interconnect structure includes a copper wire filling the second trench, the copper wire in direct contact with the tungsten plug.

A second embodiment of the present disclosure provides a method for forming an interconnect structure on a substrate. The substrate includes a tungsten contact to one or more electronic devices. The method includes depositing a dielectric material on the substrate and forming at least one first opening in the dielectric material to expose the tungsten contact. The method includes depositing a diffusion barrier liner in the at least one first opening. The method includes forming a second opening in the diffusion barrier liner to partially uncover the tungsten contact. The method includes filling at least the first opening and the second opening with copper and planarizing a top surface of the interconnect structure, leaving the copper exposed.

A third embodiment of the present disclosure provides a method for forming an interconnect structure on a substrate. The substrate includes a tungsten contact to one or more electronic devices. The method includes depositing a depositing a first dielectric material on the substrate and a copper diffusion barrier on the first dielectric material. The method includes depositing a second dielectric material on the copper diffusion barrier. The method includes forming at least one first opening in the second dielectric material, the first dielectric material and the copper diffusion barrier layer to expose the tungsten contact. The method includes depositing a dielectric material on the substrate filling the at least one first opening. The method includes forming at least one second opening in the second dielectric material over the first opening and depositing a diffusion barrier liner in the second opening and the at least one opening. The method includes removing a bottom portion of diffusion barrier liner to leave side walls of the diffusion barrier liner on the second opening and the at least one opening and exposing the tungsten contact. The method includes filling the second opening with copper and planarizing a top surface of the interconnect structure, leaving the copper exposed.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which:

FIGS. 1(a)-1(g) illustrate cross-sectional views of embodiments of a method for forming the electronic device shown in FIG. 1(g).

FIGS. 2(a)-2(g) illustrate cross-sectional view of embodiments of a method for forming the electronic device shown in FIG. 2(g).

FIGS. 3(a)-(c) illustrate cross-sectional views of an alternate embodiments of a method for forming an electronic device.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

Resistance of wires or vias in integrated circuits has become an issue as IC's have become smaller. In an interconnect structure having a copper wire or via, a liner or diffusion barrier is required to prevent diffusion of copper atoms into the surrounding dielectric material. As an example, a trench having a width of 20 nanometers (nm) wide, and a height of 40 nm is required in many interconnect structures. A liner is required to prevent diffusion of the copper into the adjacent layers. A typical liner of tantalum is 4.5 nm in thickness. Thus, the copper portion of the wire is 11 nm wide and 35.5 nm tall if the liner is deposited to its full thickness inside the trench. When one calculates, the combined horizontal and vertical resistance for a 1 micron length of copper wire with a via or contact on the end, the copper wire provides 51 ohms (Ω) of resistance, while the liner contributes an additional 37Ω of resistance. Elimination of the liner would greatly decrease the resistance of the copper via or wire.

Figure 1E:
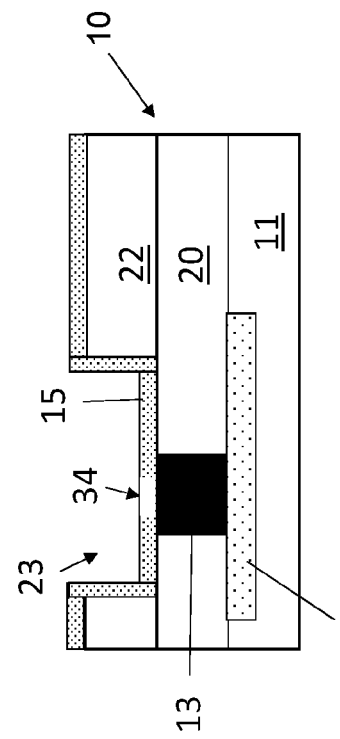

Referring to FIGS. 1(a)-(g) cross-sectional views of a method of manufacturing interconnect structures and the interconnect structures produced therefrom. The interconnect structures have reduced resistance in the wires are shown. FIG. 1(a) show an interconnect structure 10 having a damascene tungsten contact 13 in a trench of a first dielectric layer 20. This contact could be circular or rectangular when viewed from above, as known in the art.

Tungsten contact plug 13 can be formed, e.g., by application of damascene process as known in the art. For example, a contact hole can be patterned and etched down to the underlying conductors; a titanium-based liner or tantalum-based liner can be deposited using atomic layer deposition; tungsten could be deposited to fill in the contact hole; and excess tungsten and liner can be removed using chemical mechanical polishing. Any known method of forming a tungsten contact 13 can be used, including other methods like selective plating or CVD. Although a tungsten contact 13 is shown here, any contact metallurgy which acts as a copper diffusion barrier could be used.

The tungsten contact is in electrical contact with an electronic device 12 on a substrate 11. Substrate 11 can include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. The structure shown in FIG. 1(a) may be formed using any now known or later developed IC fabrication techniques.

In FIG. 1(b) a second dielectric layer 22 is deposited on the surface of the first dielectric layer 20. Layer 20 or 22 could be composed of one or more dielectrics, such as $SiO_2$, SiCOH, fluorinated silicate glass (FSG, $FSiO_2$), silicon nitride ($Si_3N_4$), silicon oxide ($SiO_2$), fluorinated silicate glass (FSG), hydrogenated silicon oxycarbide (SiCOH), porous SiCOH, boro-phospho-silicate glass (BPSG), silsesquioxanes, polymers, carbon (C) doped oxides, phosphorous doped oxides, boron doped oxides and thermosetting polyarylene ethers or porous versions of these materials and might contain thin layers of SiN, SiCN, etc. to act as an etch stop at the lower interface or as a polish stop or hard mask at the upper interface. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Second dielectric layer 22 is lithographically patterned and etched to form a wire trench 23 as is shown in FIG. 1(c). In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 1D:
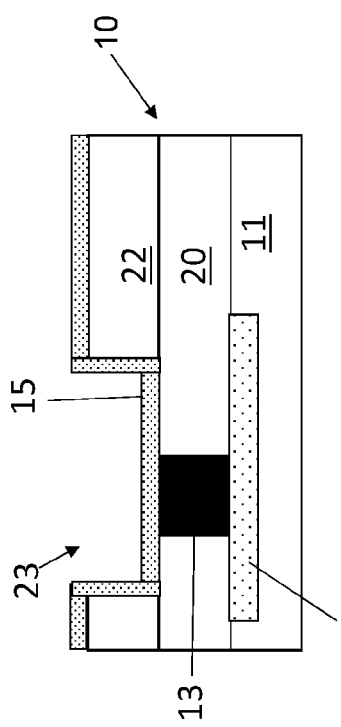

As shown in FIG. 1(d), a diffusion barrier liner 15 may be deposited to prevent copper diffusion. Diffusion barrier liner 15 may include but is not limited to ruthenium; however, other refractory metals such as refractory metal compounds such as a tantalum nitride (TaN) and/or tantalum (Ta) amy be used. Liner 15 is formed upon sidewalls and bottoms of each wire trench opening 23 and in regions away from the wire opening. In addition or alternatively to TaN and/or Ta, liners 15 can be composed of other metals such as cobalt (Co), manganese (Mn), titanium (Ti), titanium nitride (TiN), tungsten (W), tungsten nitride (WN), tungsten silicide (WSi), ruthenium (Ru), ruthenium nitride (RuN), iridium (Ir), rhodium (Rh) and platinum (Pt), etc., or mixtures of thereof (e.g., alloys), or mixtures of thereof, may also be employed. Liner 15 can be formed using any known method, such as physical vapor deposition, chemical vapor deposition, atomic layer deposition, etc. as known in the art.

Figure 1G:
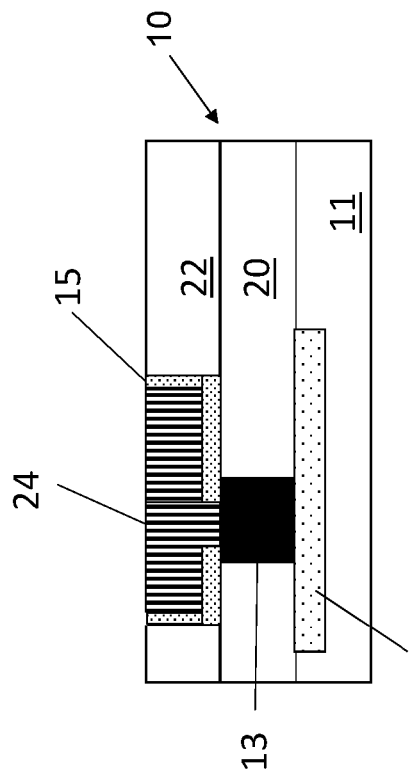
Figure 1F:
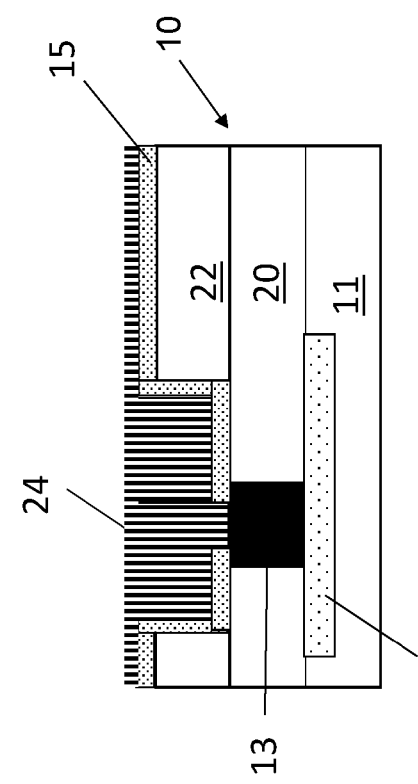

In FIG. 1(e), a lithographic pattern and etch may create an opening 34 exposing the surface of tungsten contact 13. Opening 34 does not expose the first dielectric layer 20 surrounding tungsten contact 13. As shown in FIG. 1(f), deposition of copper 24 is performed to fill openings 34 (FIG. 1(e)) and opening 23 (FIG. 1(c)) with copper 24. Copper layer 24 could be formed, for example, by the deposition of a thin seed layer using a PVD process followed by a thick layer using electroplating, as known in the art. In FIG. 1(g), the upper surface of the interconnect structure 10 is planarized to remove excess copper and liner. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

FIG. 1(g) shows a cross-sectional view of an interconnect structure 10 including a dielectric layer containing an electronic device 12 or logic circuitry component. The electronic device is disposed in substrate 11 as known in the art. Tungsten plug 13 is in direct contact with the electronic device 12 in the first dielectric layer 20. First dielectric layer 20 surrounds the tungsten plug 13. A second dielectric layer 22 is disposed over first dielectric layer 20. Tungsten plug 13 has an upper surface coplanar with the upper surface of first dielectric layer 20. Diffusion barrier liner 15 is between first dielectric layer 20 and second dielectric layer 22. Copper 24 forms a copper wire directly contacting tungsten plug 13. Copper wire 24 is bounded by diffusion barrier liner 15, except for the contact area between copper wire 24 and tungsten plug 13. The absence of a diffusion barrier liner between copper wire 24 and tungsten plug 13 lowers the resistance of the wire providing a structure that has higher performance.

Figure 2G:
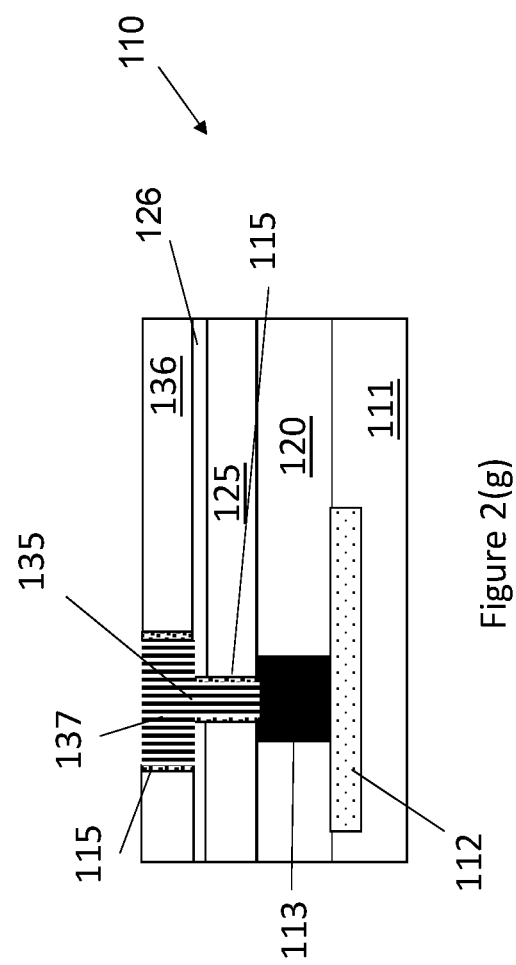

Referring to FIGS. 2(a)-(g) an alternate embodiments of a method of forming an interconnect structure having reduced resistance in copper wires is shown. FIG. 2(a) show an interconnect structure 110 having a damascene tungsten contact 113 in a trench in first dielectric layer 120. Tungsten contact 113 is in electrical contact with an electronic device or wire 112 on a substrate 111. A diffusion barrier dielectric 126 is deposited on the surface of dielectric layer 120 in FIG. 2(b), followed by an intermetal dielectric layer 136. Diffusion barrier dielectric 126 prevents diffusion of the copper molecules and can be composed of silicon nitride, silicon carbide, silicon carbonitride, etc. as known in the art. Intermetal dielectric 136 can be formed from SiCOH, SiO2, etc. as known in the art. Dielectric layer 136 is lithographically patterned and dielectric layers 136, 126 and 125 are etched to form an opening 135, exposing the surface of tungsten contact 113. This is shown in FIG. 2(c). In FIG. 2(d), a lithographic pattern and etch creates and opening 138 etching dielectric layer 136 down to dielectric diffusion barrier layer 126 to create a trench for a copper wire. The opening 135 in FIG. 2(c) does not touch dielectric layer 120 surrounding tungsten contact 113. Diffusion barrier liner 115 such as tantalum is deposited in the opening and etched back to leave the liner 115 on the sidewalls the dielectric layers 125 and 136, but removing it from a bottom surface of opening 138. This is shown in FIG. 2(e). Deposition of copper 124 is performed to fill the opening 138 with copper as shown in FIG. 2(f). In FIG. 2(g), the excess copper is removed to through chemical mechanical polishing to planarize the surface of the interconnect device. The final dual damascene copper wire shown in FIG. 2(g) has copper diffusion barrier 115 on the sides of copper 124 and copper diffusion barrier 126 under wire 137 and the tungsten contact 113 under via 135. The copper 124 (FIG. 2(f)) forms wire 137 and via 135 (FIG. 2(g)). If opening 135 was formed after etching the trench 137 and deposition/etchback of diffusion barrier liner 115, then diffusion barrier liner 115 would not be formed on the sides of the opening 135, thusly necessitating the use of an intermetal dielectric layer 125 which is also a copper diffusion barrier.

The interconnect structure of FIG. 2(g) shows an interconnect structure including a dielectric layer containing an electronic device 112 or logic circuitry component. First dielectric layer 120 surrounds tungsten plug 113. Tungsten plug 113 has an upper surface coplanar with the upper surface of dielectric layer 120. A dielectric diffusion barrier liner 125 is on the surface of dielectric layer 120 surrounds a copper wire 124, except for the contact area between copper wire 124 and tungsten plug 113. A dielectric layer 136 is over first dielectric layer 120. Copper wire 124 directly contacts tungsten plug 113. The absence of a liner between copper wire 124 and tungsten plug 113 lowers the resistance of the wire providing a structure that has higher performance.

Referring to FIGS. 3(a)-(c) an alternate embodiments of a method of forming an interconnect structure having reduced resistance in copper wires is shown for multi-level structures. FIG. 3(a) shows a damascene tungsten contact to devices as known in art. The structure shown in 3(a) includes a contact 253 connected to a first level wire 230. A dielectric layer 236 is deposited over the structure of 3(a) and is shown in FIG. 3(b). A copper diffusion barrier over copper wire 230 is not explicitly shown in FIG. 3(a). Either a metal cap could be formed over copper wire 230, such as by electroplating CoWP, or a dielectric diffusion barrier, such as SiN or other dielectrics as known in the art, could be formed over copper wire 230 and the surrounding dielectric, as known in the art. A tungsten damascene via 213 is formed in FIG. 3(c). Using the method described in FIGS. 1(a)-1(g) on the structure in FIG. 3(c) results in the structure shown in FIG. 4.

Figure 4:
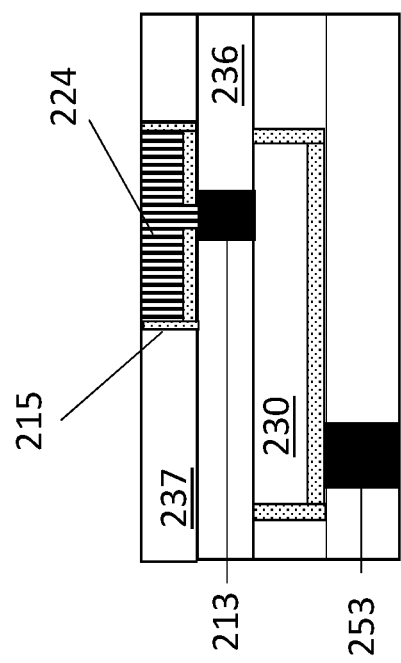
FIG. 4 shows cross-sectional views of embodiments of an interconnect structure formed from the method of FIG. 3(a)-(c) and FIG. 1(a)-(g).
Figure 5:
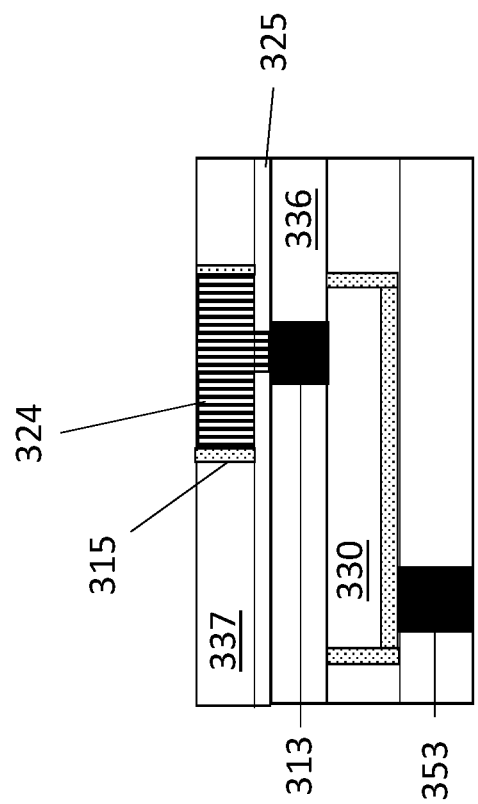
FIG. 5 shows cross-sectional views of embodiments of an interconnect structure formed from the method of FIGS. 3(a)-(c) and FIGS. 2(a)-(g).

Tungsten plug 213 in FIG. 4 has an upper surface coplanar with the upper surface of dielectric layer 236. A diffusion barrier liner 215 is between first dielectric layer 236 and a second dielectric layer 237. A copper wire 224 directly contacts tungsten plug 213. Copper wire 224 is bounded by diffusion barrier layer 215, except for the contact area between copper wire 224 and tungsten plug 213. The absence of a diffusion barrier liner between copper wire 224 and tungsten plug 213 lowers the resistance of the wire providing a structure that has higher performance. Tungsten plug via 213 is shown fully landing on copper wire 230 but it could also be partially landed on the copper wire 230 and also touching the liner and surrounding dielectric, as known in the art.

Using the method described in FIGS. 2(a)-2(g) on the structure in FIG. 3(c) results in the structure shown in FIG.

5. Tungsten plug 313 has an upper surface coplanar with the upper surface of dielectric layer 336. A dielectric diffusion barrier liner 325 is on the surface of dielectric layer 336 and covers dielectric layer 336, except for the contact area between copper wire 324 and tungsten plug 313. Dielectric layer 337 is over first dielectric layer 336. Copper wire 324 directly contacts tungsten plug 313. The absence of a diffusion barrier liner 325 between copper wire 324 and tungsten plug 313 lowers the resistance of the wire providing a structure that has higher performance. As with FIG. 2(g), liner layer 37 could be formed on the sides of the opening in dielectric layer 25.

Electronic devices 12, 112 can be active or passive. An active device can be a transistor, e.g., field effect transistor (FET); whereas, a passive device can be a wiring structure, resistor, capacitor, diode, memory cell or varactor etc., all of which are fabricated in a conventional manner such that further explanation is not required for an understanding of the disclosure.

Dielectric layers 20, 22, 120, 136, 236, 237, 336 and 337 (and corresponding sequences in later embodiments) may be formed of any suitable dielectric material, although low-k dielectric materials are preferred. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell).

Opening in the dielectric layers 23, 34, 135, 138 (and sequences in later embodiments) may be created through masking layers and conventional lithography and reactive ion etching (RIE).

Diffusion barrier liners are preferably formed of titanium nitride, tantalum, tantalum nitride or tungsten, and may be deposited by physical vapor deposition (PVD) or by CVD. Following deposition of liner material and the copper, excess material is preferably removed by CMP or sputter etchback to make the top surface of copper coplanar with the top surface of dielectric layer.

In any embodiment, the copper wire 24 has a total thickness of approximately 5 nm to approximately 3000 nm. As used herein, "approximately" indicates +1-10% of the value(s) stated.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An interconnect structure for one or more electronic devices formed on a substrate, the interconnect structure comprising:
 a first interlevel dielectric (ILD) layer over the one or more electronic devices;
 a first trench in the first ILD layer;
 a tungsten contact filling the first trench and in electrical contact with the one or more electronic devices;
 a second ILD layer over the first ILD layer;
 a second trench in the second ILD layer over the tungsten contact;
 diffusion barrier liners on all sides of the second trench except at a surface of the tungsten contact, wherein the diffusion barrier liners are selected from the group consisting of: titanium nitride (TiN), tantalum nitride (TaN), tantalum (Ta), ruthenium (Ru), ruthenium nitride (RuN), tungsten (W), tungsten nitride (WN), tungsten silicide (WSi), and titanium (Ti); and
 a copper wire filling the second trench, the copper wire in direct contact with the tungsten contact and with the diffusion barrier liners.

2. The interconnect structure of claim 1, wherein the one or more electronic devices are selected from the group consisting of: capacitors, diodes, resistors, transistors, memory cells, varactors, active devices and passive devices.

3. The interconnect structure of claim 1, wherein the copper wire has a thickness ranging from approximately 5 nanometers (nm) to approximately 3000 nm.

4. The interconnect structure of claim 1, wherein the first ILD layer and is selected from the group consisting of: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, polymers, carbon (C) doped oxides, phosphorous doped oxides, boron doped oxides and thermosetting polyarylene ethers.

5. The interconnect structure of claim 1, wherein the second ILD layer and is selected from the group consisting of: silicon nitride ($Si_3N_4$), silicon oxide ($SiO_2$), fluorinated silicate glass (FSG), hydrogenated silicon oxycarbide (SiCOH), porous SiCOH, boro-phospho-silicate glass (BPSG), silsesquioxanes, polymers, carbon (C) doped oxides, phosphorous doped oxides, boron doped oxides and thermosetting polyarylene ethers.

6. The interconnect structure of claim 1, wherein the diffusion barrier liner at the bottom of the second trench comprises a dielectric.

\* \* \* \* \*